(12) United States Patent
Nguyen

(10) Patent No.: US 11,132,034 B2
(45) Date of Patent: Sep. 28, 2021

(54) ELECTRONIC DEVICE FASTENER

(71) Applicant: SK hynix Inc., Icheon-si (KR)

(72) Inventor: Lock Duc Nguyen, Morgan Hill, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/688,909

(22) Filed: Nov. 19, 2019

(65) Prior Publication Data
US 2021/0149459 A1   May 20, 2021

(51) Int. Cl.
G06F 1/18 (2006.01)
H05K 7/14 (2006.01)
H01H 13/10 (2006.01)

(52) U.S. Cl.
CPC .............. *G06F 1/187* (2013.01); *G06F 1/185* (2013.01); *H05K 7/1402* (2013.01); *H01H 13/10* (2013.01)

(58) Field of Classification Search
CPC .......... G06F 1/185; G06F 1/187; G06F 1/183; G06F 1/16; H01R 24/68; H05K 7/1402; H05K 7/1417; H05K 7/1421; H05K 7/1422; H05K 7/1424; H05K 7/1425; H05K 7/1418; H05K 7/142
See application file for complete search history.

(56) References Cited

U.S. PATENT DOCUMENTS

| | | | | |
|---|---|---|---|---|
| 5,374,198 A | * | 12/1994 | Nagata | G06F 1/183 439/153 |
| 5,706,173 A | * | 1/1998 | Carney | G06F 1/184 312/223.2 |
| 5,754,406 A | * | 5/1998 | Hardt | G06F 1/184 361/732 |
| 6,406,322 B1 | * | 6/2002 | Barringer | G06F 1/184 361/752 |
| 6,778,401 B1 | | 8/2004 | Yu et al. | |
| 6,965,516 B1 | * | 11/2005 | Lin | G06F 1/1613 312/332.1 |
| 7,145,778 B2 | | 12/2006 | DeLuga et al. | |
| 7,768,789 B2 | | 8/2010 | Ni | |

(Continued)

FOREIGN PATENT DOCUMENTS

| CN | 101425324 A | 5/2009 |
|---|---|---|
| CN | 203733049 U | 7/2014 |

(Continued)

*Primary Examiner* — Rockshana D Chowdhury
*Assistant Examiner* — Douglas R Burtner
(74) *Attorney, Agent, or Firm* — Weaver Austin Villeneuve & Sampson LLP

(57) ABSTRACT

Embodiments for electronic device fasteners that enable an electronic device to be reliably and quickly secured on a host board are presented. In one exemplary embodiment, a fastening assembly includes a glider component that supports an electronic device such as an M.2 solid state drive, and slides on tracks installed on a host board to bring a handle bar in a locking position above the electronic device securing the electronic device in place. The glider component and the tracks are designed with sloped surfaces such that as the glider component slides over the tracks, when it reaches an end of the track, a stable engagement secures the electronic device in place without the need for any additional fastening mechanisms.

20 Claims, 6 Drawing Sheets

(56) References Cited

U.S. PATENT DOCUMENTS

| | | | |
|---|---|---|---|
| 8,251,729 B2 * | 8/2012 | Shin | G01R 1/0433 |
| | | | 439/337 |
| 8,305,103 B2 * | 11/2012 | Kang | G06F 11/2733 |
| | | | 324/757.01 |
| 8,717,752 B2 | 5/2014 | Dunham et al. | |
| 9,523,999 B2 * | 12/2016 | Kumachi | G06F 1/16 |
| 9,958,915 B1 * | 5/2018 | Wu | G06F 1/185 |
| 10,645,835 B1 * | 5/2020 | Sauer | G06F 1/1684 |
| 2004/0174684 A1 * | 9/2004 | Li | H05K 7/142 |
| | | | 361/752 |
| 2010/0027210 A1 * | 2/2010 | Tamura | G06F 1/185 |
| | | | 361/679.31 |
| 2011/0228462 A1 * | 9/2011 | Dang | H05K 7/1429 |
| | | | 361/679.4 |
| 2013/0288532 A1 * | 10/2013 | Lai | G06F 1/185 |
| | | | 439/629 |
| 2016/0064040 A1 * | 3/2016 | Hartman | G06F 1/20 |
| | | | 360/97.12 |
| 2016/0066468 A1 * | 3/2016 | Smith | G06F 12/00 |
| | | | 361/679.52 |
| 2016/0073537 A1 * | 3/2016 | Tseng | G06F 1/183 |
| | | | 361/809 |
| 2017/0108891 A1 * | 4/2017 | Hua | G06F 1/16 |
| 2018/0210517 A1 | 7/2018 | Yun | |
| 2020/0220286 A1 * | 7/2020 | Bettman | H01R 13/502 |
| 2021/0026421 A1 * | 1/2021 | Ball | G11B 33/124 |

FOREIGN PATENT DOCUMENTS

| | | |
|---|---|---|
| CN | 109116933 A | 1/2019 |
| KR | 200443263 Y1 | 1/2009 |
| KR | 100925992 B1 | 11/2009 |
| KR | 100999565 B1 | 12/2010 |
| KR | 101677709 B1 | 11/2016 |
| KR | 101715227 B1 | 3/2017 |
| KR | 101954293 B1 | 3/2019 |
| WO | 2016008718 A1 | 1/2016 |

\* cited by examiner

ELECTRONIC DEVICE FASTENER

BACKGROUND OF THE INVENTION

Electronic systems, such as desktop computers, servers, laptops, smart phones and the like use electronic devices, such as data storage devices, to operate. One example of an electronic device is the Solid State Drive (SSD) which typically includes memory circuitry such as flash memory along with a controller. In various applications, from computer systems to manufacturing environments, electronic devices such as SSDs have to be secured on a substrate or a board such as an add-in-card (AIC) or a printed circuit board (PCB). The process of securing an electronic device onto a board may damage the device. For example, one of type of SSD known as an M.2 SSD, is a relatively flat rectangular shaped device that is internally mounted and does not include a protective case. Components on the M.2 SSD are therefore fully exposed and as a result can be easily knocked loose or damaged by external forces introduced during handling and installation. Moreover, the device PCB itself can be damaged as a result of bending when the device is inserted into, or removed from, the host without proper handling. Current mechanisms for securing electronic devices on a board either require the operator to use a driver to torque a fastener such as a screw to secure the device, or to press down on the device to engage a spring-loaded mechanism that retains the device in place. The force exerted directly on the electronic device during installation in such mechanisms can cause damage to the device components and/or the board. Furthermore, these mechanisms of fastening the electronic device on an AIC or PCB are typically designed for single device installations. Therefore, in certain environments such as testing during manufacturing, such single device fastening mechanisms increase the time it takes to test and debug multiple devices, thereby decreasing production volume as well as increasing cost.

There is therefore a need for a more reliable mechanism to quickly and efficiently install one or more electronic devices on a board in an easily repeatable manner.

BRIEF SUMMARY OF THE INVENTION

Embodiments of the present disclosure relate to electronic device fasteners that enable an electronic device to be reliably and quickly secured on a host board. In one exemplary embodiment, a fastening assembly includes a glider component that supports an electronic device such as an M.2 solid state drive, and slides on tracks installed on a host board to bring a handle bar in a locking position above the electronic device securing the electronic device in place. The glider component and the tracks are designed with sloped surfaces such that as the glider component slides over the tracks, when it reaches an end of the track, a stable engagement secures the electronic device in place without the need for any additional fastening mechanisms.

In one embodiment, an apparatus includes a fastening assembly having a glider component and first and second slider tracks, wherein, the glider component includes first and second glider bases, each glider base having a first surface with a gliding guide and a guide wall extending in parallel on the first surface, whereby an edge of the first surface of each glider base extending from its respective guide wall forms a shelf. The glider component further including a handle bar coupling an end of the first glider base to an end of the second glider base forming a monolithic structure for the glider component. Further, each of the first and second slider tracks has a first foot and a second foot with a track span formed therebetween, each foot having a fastening feature to enable fastening the slider track to a base structure, the track span having an inner surface with a track gap formed therein. The track gap is designed with a dimension to fit the gliding guide therein, enabling sliding of the glider component over the first and second tracks in alignment with the gliding guide. Further, a top surface of each gliding guide and an inner surface of each track gap include sloped sections such that as the glider component slides over the tracks, when it reaches an end of the track, a stable engagement is secured between the gliding guides and the tracks.

The apparatus may further include a host board, the host board having a first interface connector installed thereon and further including four board engagement features that engage fastening features of the first and second slider tracks to secure the first and second slider tracks on the host board. The apparatus may also include an electronic device that has a substantially rectangular and substantially flat printed circuit board having a second interface connector at one edge and one or more components on a first surface, the electronic device resting on the shelves of the glider component with the second interface connector mating with the first interface connector of the host board.

In another embodiment, a fastening assembly includes a host board having a first interface connector, a first slider track and a slider second track installed in parallel on the host board, and a glider component having a first gliding guide engaging the first slider track and a second gliding guide engaging the second slider track. The glider component further includes a first shelf and a second shelf, and a handle bar adapted to slide the glider component along the first and second slider track. The fastening assembly further includes an electronic device having a second interface connector mating with the first interface connector of the host board, the electronic device resting on the first shelf and the second shelf of the glider component, wherein, the glider component is configured such that the handle bar slides over the top surface of the electronic device along the first and second slider tracks arriving at a locking position at a point between a front edge and the back edge of the electronic device, thereby securing the electronic device in place.

In yet another embodiment, an electronic device fastening system includes a glider component having first and second glider base, each glider base having a first surface with a gliding guide and a guide wall formed thereon extending in parallel on the first surface, whereby an edge of the first surface of each glider base extending from the guide wall forms a shelf for the electronic device to rest on. The glider component further includes a handle bar coupling an end of the first glider base to an end of the second glider base forming a monolithic structure for the glider component. The fastening system further includes first and second slider tracks, each slider track having a first foot and a second foot with a track gap formed therebetween, each foot having a fastening feature to enable fastening the slider track to a base structure, and the track gap having a dimension designed to fit the gliding guide therein, enabling sliding of the glider component over the first and second tracks in alignment with the gliding guide. A top surface of each gliding guide and an inner surface of each track gap are sloped at predetermined angles such that as the glider component slides over the tracks, when it reaches an end of the track, a stable engagement is secured between the gliding guides and the tracks. Further, when the glider component reaches the end of the track, the handle bar rests on substantially mid-point of the length of the electronic device locking the electronic device in place in a reliable manner.

DETAILED DESCRIPTION OF THE INVENTION

A detailed description of various exemplary embodiments of the present disclosure is provided below along with accompanying figures that illustrate aspects of the exemplary embodiments. It is to be understood that specific details set forth below are exemplary and are for purposes of providing a better understanding of the invention as well as to provide those skilled in this art with an enabling description for implementing various embodiments. The scope of the invention is not limited to the specific and exemplary embodiments described herein.

Figure 1:
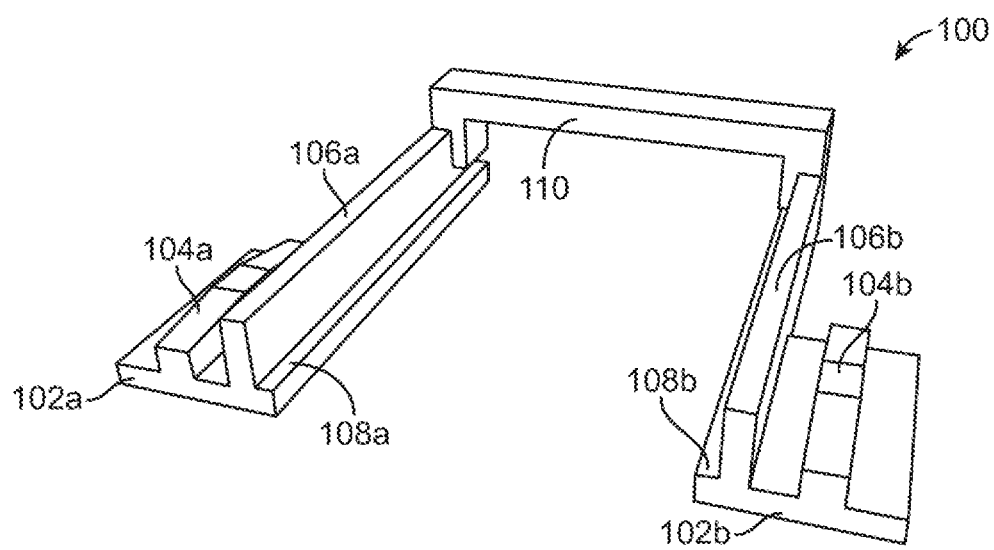
FIG. 1 is an isometric drawing of an exemplary glider component of an electronic device fastening system according to one exemplary embodiment of the present disclosure.

Referring to FIG. 1, there is shown an isometric view of an exemplary glider component 100 of an electronic device fastening system according to one exemplary embodiment of the present disclosure. Glider component 100 includes first and second gliding bases 102. Gliding bases 102 allow glider component 100 to sit flat on the surface of a host board such as a printed circuit board PCB (not shown). On a top surface of each gliding base 102 is formed a gliding guide 104 extending in parallel with a gliding wall 106. Gliding guides 104 keep glider 100 in alignment during gliding, and gliding walls 106 ensure the electronic device loaded onto the glider is maintained in place and in proper alignment to make contact with a connector on a host board (not shown). A portion of the top surface of each gliding base 102 extending from guide wall 106 to an edge of each gliding base 102 forms a shelf 108. As described further below, shelves 108a and 108b receive an electronic device that rests on the shelves 108a and 108b in the fastening process. Glider component 100 further includes a handle bar 110 coupling an end of first glider base 102a to an end of the second glider base 102b forming a monolithic structure for glider component 100. Handle bar 110 allows operator finger access for sliding glider component 100 to secure the electronic device. Exemplary dimensions and other features for glider component 100 are described further below.

Figure 2:
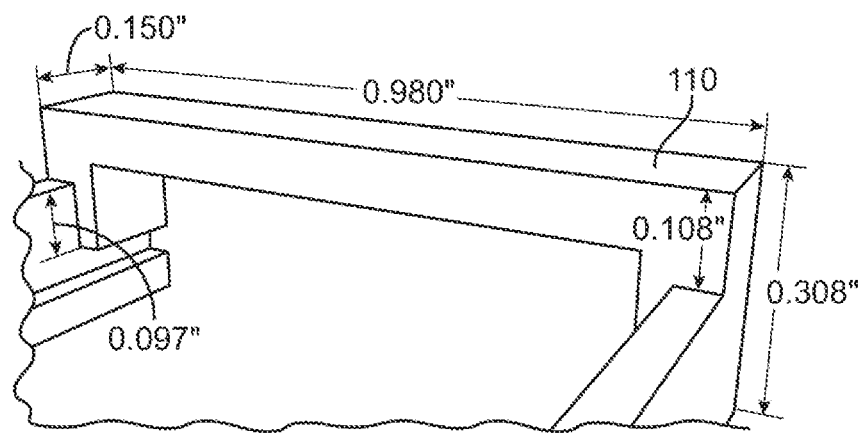
FIG. 2 is an enlarged isometric view of a handle bar portion of the exemplary glider component shown in FIG. 1.

FIG. 2 provides an enlarged isometric view of handle bar 110 with exemplary dimensions for various structural aspects of the handle bar indicated therein. All dimensions provided in the figures herein are optimized for securing a specific electronic device, in this example, an M.2 solid state drive card, on a host board. It is to be understood therefore that these dimensions (e.g., 0.980 inches for the span of handle bar 110, as shown in FIG. 2) are for illustrative purposes only and will vary depending on the dimensions of the electronic device to be secured.

Figure 3:
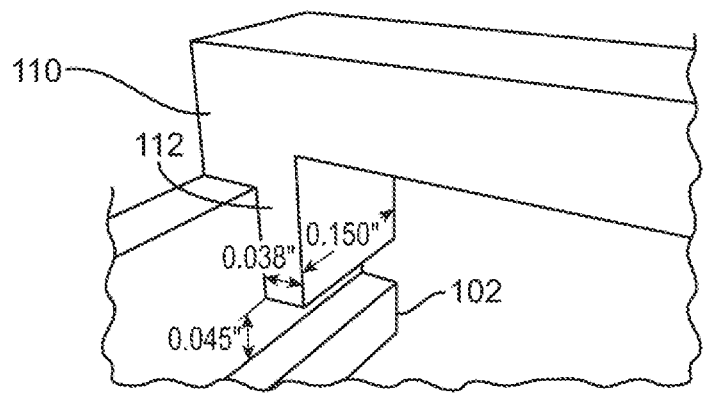
FIG. 3 is an enlarged isometric view of the portion of the exemplary glider component of FIG. 1 where the handle bar and a glider shelf meet and provide a guard feature.
Figure 4:
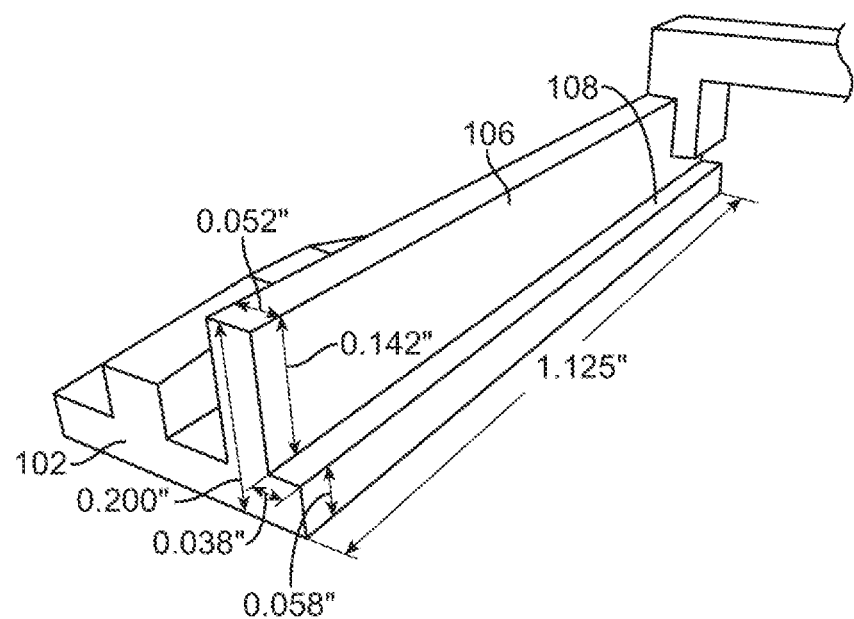
FIG. 4 is an enlarged isometric view of the glider base illustrating the glider shelf portion and glider wall portion of the exemplary glider component of FIG. 1.
Figure 5:
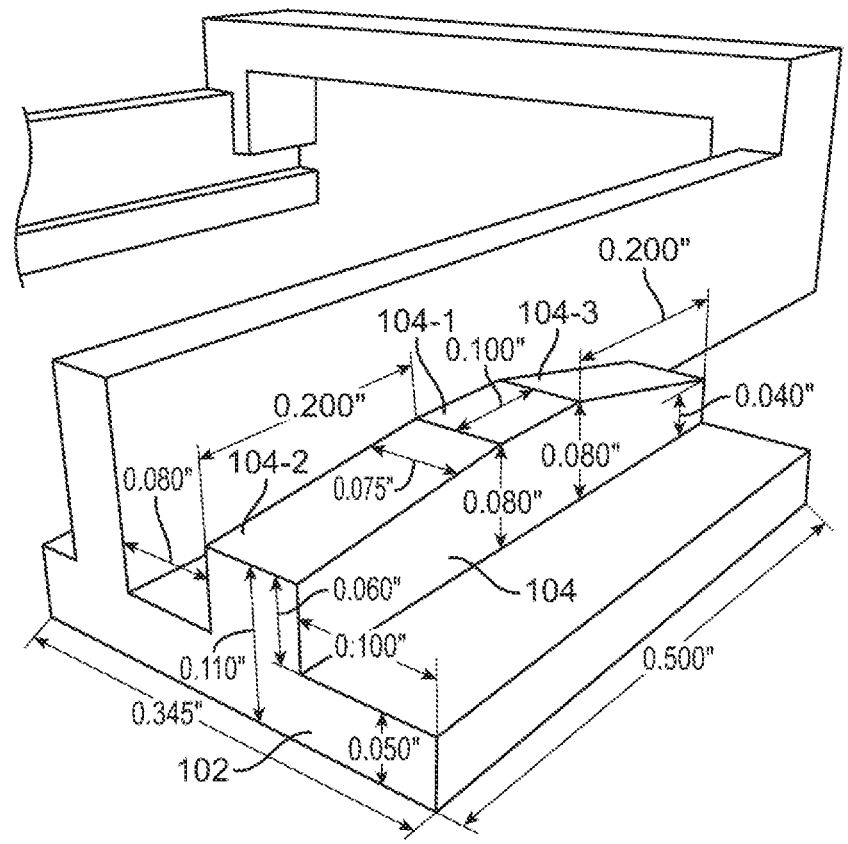
FIG. 5 is an enlarged isometric diagram of the gliding base and gliding guide portions of the exemplary glider component of FIG. 1.

Referring now to FIG. 3 there is shown an enlarged isometric view of an end portion of handle bar 110 as it attaches to gliding base 102 forming a guard feature 112, with exemplary dimensions provided therein. Guard feature 112 is designed to secure the electronic device in place. FIG. 4 provides an enlarged isometric view of a glider base 102 highlighting exemplary dimensions for guide wall 106 as well as shelf 108. Structural features and exemplary dimensions for gliding guide 104 are provided in FIG. 5, which is an enlarged isometric diagram of gliding guide portion of glider component 100. As depicted in FIG. 5, the top surface of gliding guide 104 is sloped at predetermined angles in a manner that results in three distinct sections. A central flat section 104-1 of the top surface of gliding guide 104 is at a height of, for example, 0.080" for a span of, for example, 0.100". A front sloped section 104-2 slopes downwards for a span of, for example, 0.200" to a height of, for example, 0.060" at its terminal section at the front edge of glider base 102. A back sloped section 104-3 slopes downwards for a span of, for example, 0.200" to a height of 0.040" at its terminal section at the back edge of glider base 102. As described further below, the sloped surface of gliding guide 104 enables a tight locking mechanism as glider component 100 slides into its final fastening position.

Figure 6:
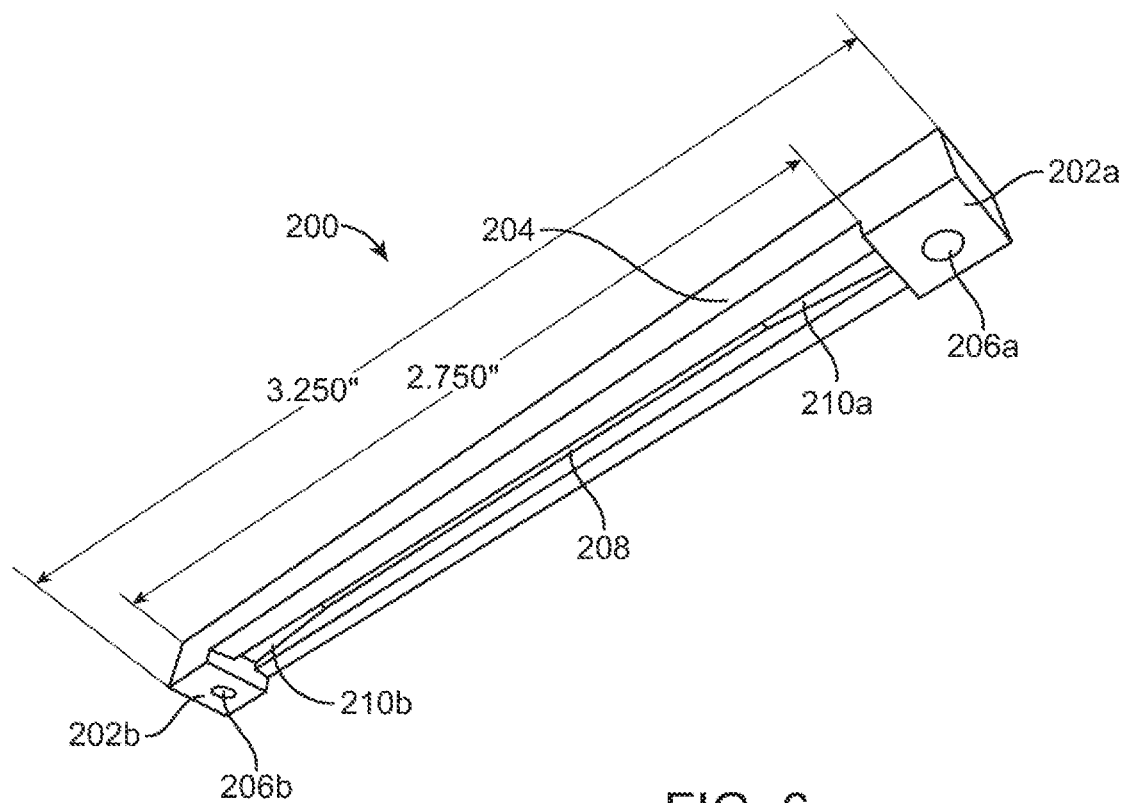
FIG. 6 is an isometric drawing of a track component of the electronic device fastening system according to one exemplary embodiment of the present disclosure.

The electronic device fastening system of the present disclosure also includes a pair of slider tracks that engage gliding component 100. FIG. 6 is an isometric drawing of a slider track 200 of the electronic device fastening system according to the exemplary embodiment of the present disclosure. Slider track 200 is made up of first foot 202a and second foot 202b connected by a track span 204. Each foot 202 has a fastening feature 206, such as a screw hole, to enable fastening the slider track to a base structure. Slider track span 204 is designed with a gap 208 formed inside an inner surface of span 204. A width of track gap 208 is designed to hold gliding guide 104 of glider component 100 in place and in alignment as glider component 100 slides over the tracks. The inner surface of track gap 208 is designed to have a sloped section 210 at each end of the span. Track gap sloped sections 210 are designed to engage with sloped surfaces of gliding guide 104 to secure glider component 100 when it is slid to the end of the tracks.

Figure 7:
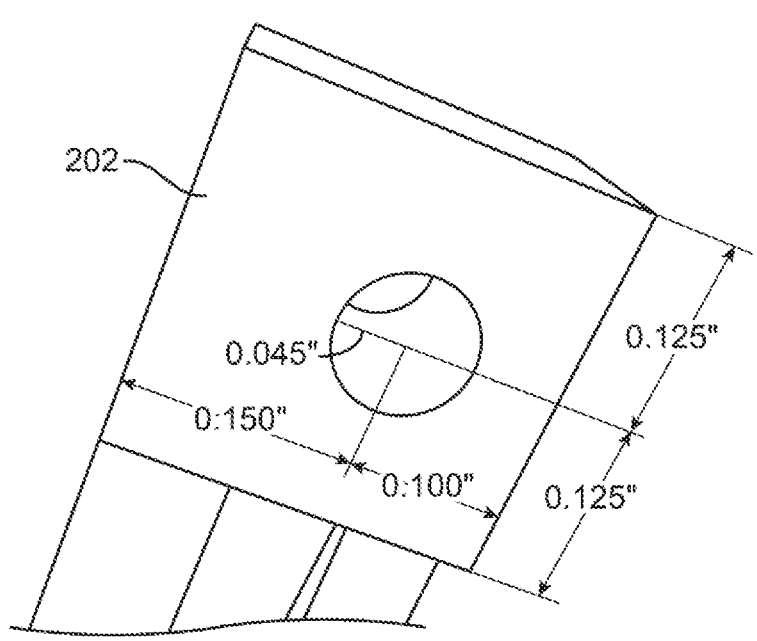
FIG. 7 is an enlarged isometric view of a foot portion of the track component of FIG. 6.
Figure 8:
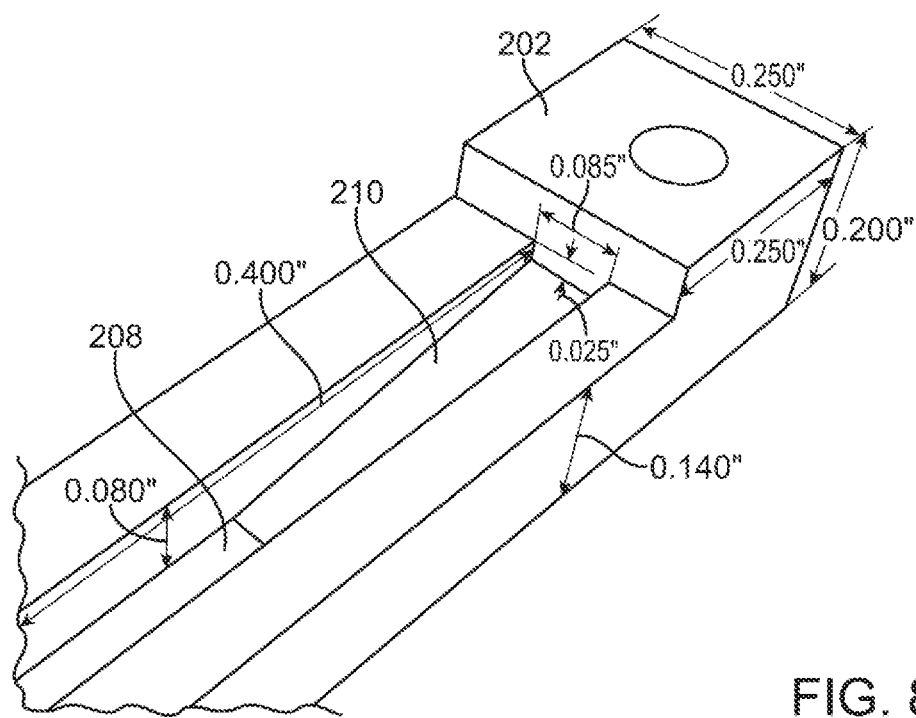
FIG. 8 is an isometric diagram illustrating a gap portion of the track component of FIG. 6.
Figure 9:
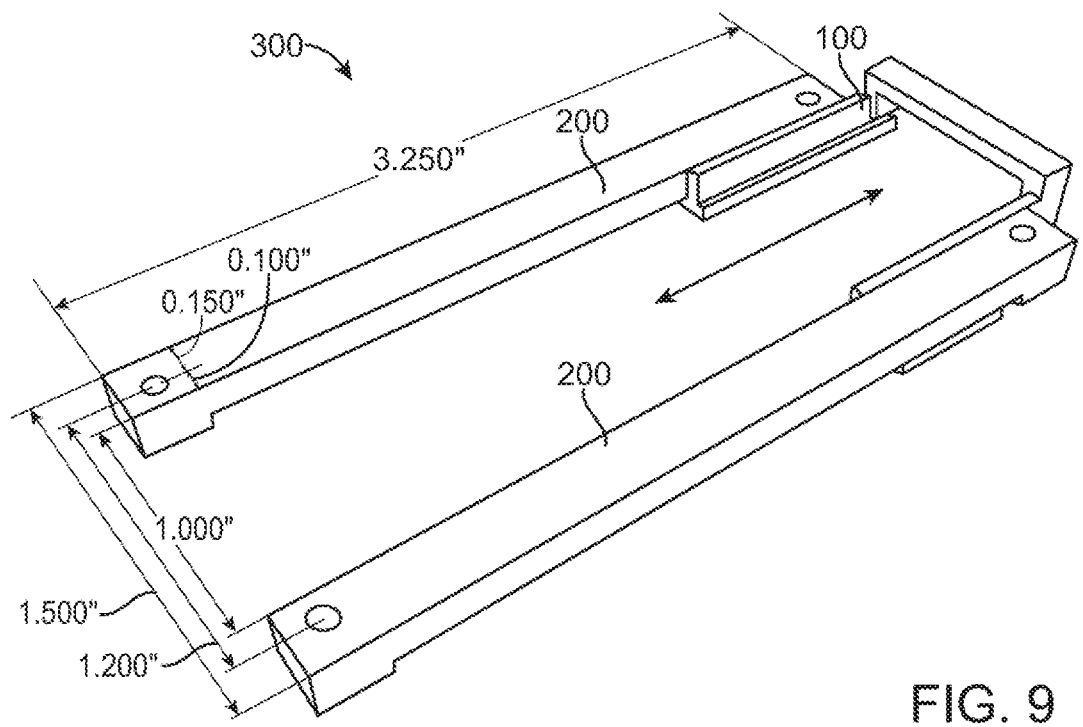
FIG. 9 is an isometric drawing of the glider component and track components assembled together according to an exemplary embodiment of the fastening system of the present disclosure.

FIG. 7 is an enlarged isometric diagram of one foot 202 of slider track 200 illustrating fastening feature 206 with exemplary dimensions indicated therein. Fastening feature 206, in this example, is a screw hole that may be threaded for 3M (metric) or #4-40 (UNF) screws. FIG. 8 is an enlarged isometric drawing of one end of slider track 200 highlighting exemplary dimensions for track gap 208 and sloped section 210. According to this example, track gap 208 has a width of 0.085" and a depth of 0.080" at its center. Sloped section 210 starts including upwards from the depth of 0.080" over a distance of, for example, 0.400" from an end of track gap 208, defining a depth of 0.025" at its terminus at a side surface of track foot 202. FIG. 9 is an isometric diagram depicting glider component 100 engaged with slider tracks 200 forming an electronic device fastening assembly 300 according to this exemplary embodiment of the present disclosure.

Figure 10:
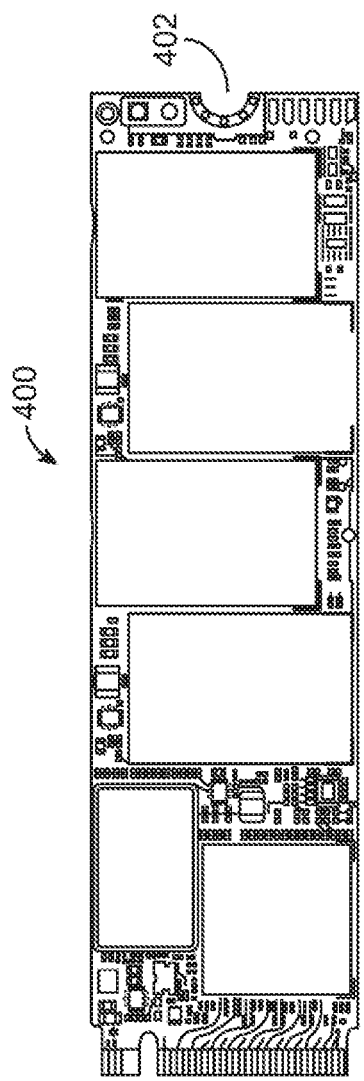
FIG. 10 is a top view illustrating an exemplary electronic device such as an M.2 solid state drive, that may be fastened by the fastening system of the present disclosure.

Referring now to FIG. 10, a top view of an exemplary electronic device 400 such as a memory expansion card. In this example, electronic device 400 is a SSD storage card and more specifically an M.2 drive. While embodiments of this disclosure are described herein in the context of an M.2 drive, the invention applies to any type of electronic device having a similar general shape, i.e., relatively flat and substantially rectangular, that may have different dimensions and constructions than those of the M.2 card. Thus M.2 drive is sometimes referred to herein simply as drive, card or electronic device. As depicted in FIG. 10, M.2 drive 400 is a relatively flat, substantially rectangular piece that includes various functional components mounted on a PCB. The various components may include, for example, NAND flash memory chips, memory controller, interface controller, interface connector 402 such as SATA, PCI, etc. In the case of this specific type of M.2 drive 400 there is also provided a mounting cut-out or hole 404 at an edge of the PCB opposite to the edge with interface connector 402. When installed on a host board such as an adapter card, add-in card or a PC motherboard, interface connector 402 is inserted into a mating socket on the host and a fastenening mechanism such as a screw is used to secure M.2 drive 400 onto the board through the mounting hole 404.

Figure 11:
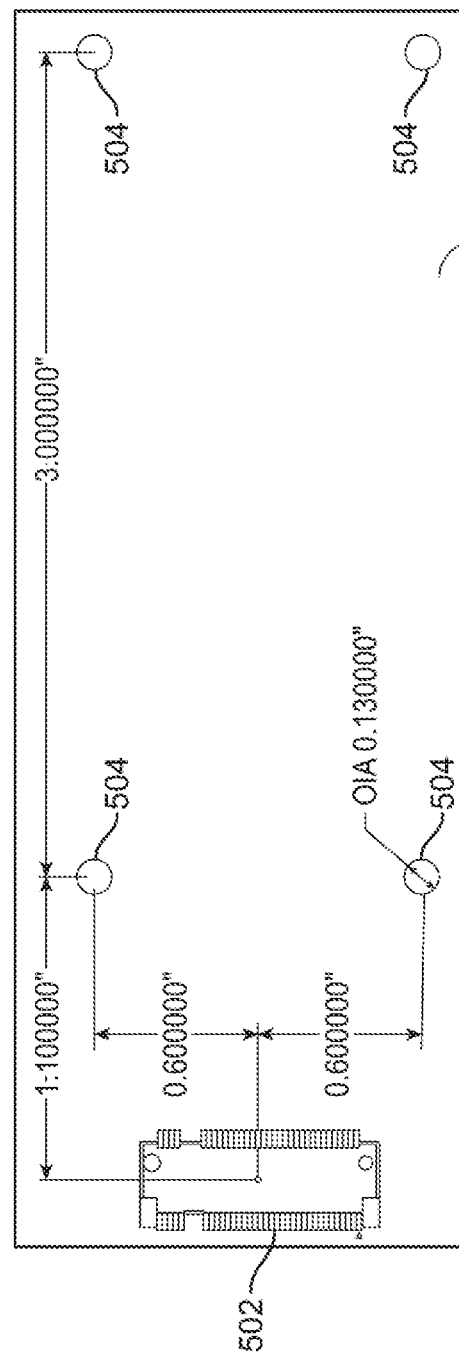
FIG. 11 is a top view of one example of a host board where the fastening system of the present disclosure may be installed.

FIG. 11 shows a simplified example of a host board 500 of the fastening assembly of the present disclosure. In this example, host board 500 may be an M.2 adapter for, for example, testing of M.2 drives, or an add-in card (AIC). Host board 500 includes an M.2 connector socket 502. Host board 500 further includes board engagement features 504 that may be, for example, drill holes, provided in predetermined positions for securing fastening assembly 300 onto board 500 in a manner that positions fastening assembly 300 in alignment with M.2 connector socket 502. While this exemplary embodiment contemplates installing slider tracks 200 on host board 500 by the use of, for example four screws, to secure fastening features (e.g., holes) 206 of slider tracks 200 into board engagement features (e.g., drill holes) 504 of host board 500, other means for installing slider tracks 200 on host board 500 are possible. For example, instead of holes 206, each foot 202 of slider tracks 200 may comprise a mating board engagement feature such as an interlocking mechanism that locks into a matching cutout on board 500, or a spring finger locking mechanism that snaps into a matching cutout on board 500. These alternative fastening mechanisms eliminate the need for fastening screws.

Figure 12A:
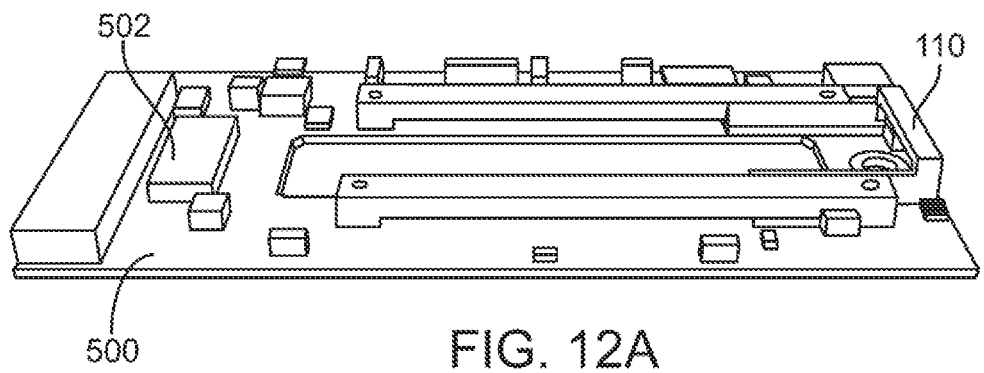
FIGS. 12A, 12B, 12C and 12D illustrate a series of steps for installing an electronic device on a host board using an exemplary embodiment of the fastening system of the present disclosure.
Figure 12B:
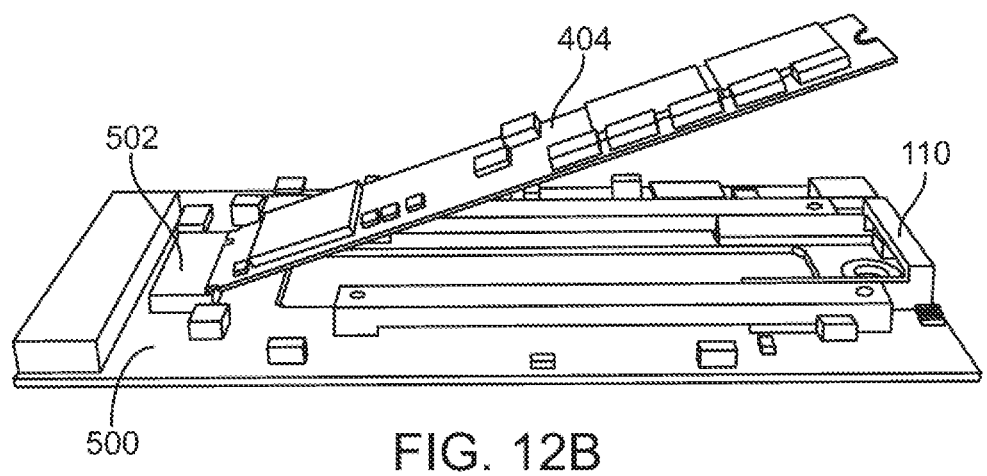
Figure 12C:
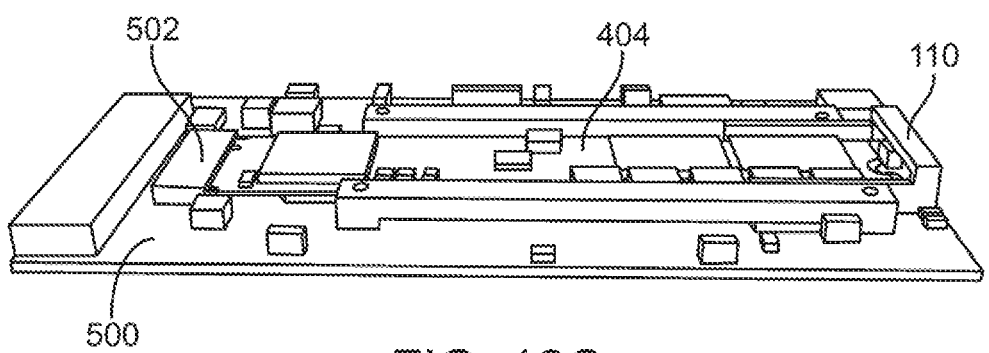
Figure 12D:
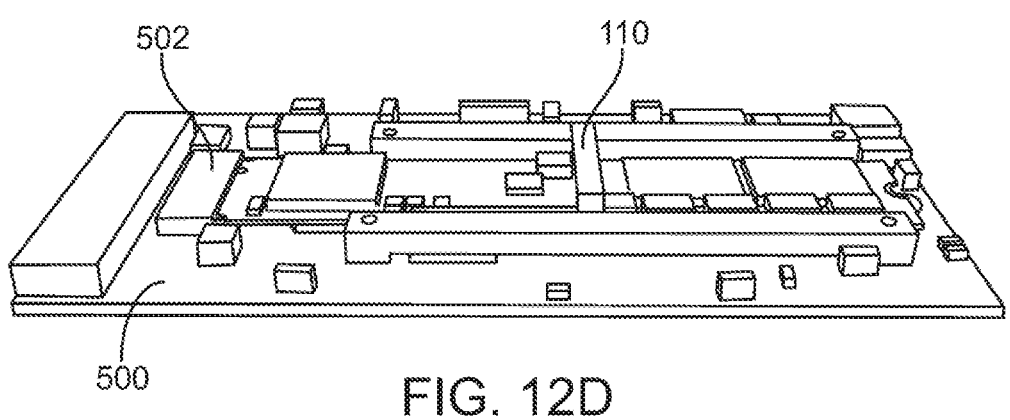

FIG. 12A shows an exemplary fastening assembly 300 mounted on an exemplary host board 500. In the configuration depicted in FIG. 12A, glider component 100 is slid all the way back for the widest possible opening to enable the placement of an electronic device such as an M.2 drive. FIG. 12B illustrates the placement of M.2 drive 400 by inserting M.2 interface connector into M.2 socket 502 on board 500. M.2 drive 400 may be inserted into socket 502 at an angle of, for example, 20 degrees. Referring now to FIG. 12C, there is shown M.2 drive 400 lowered all the way down into a level position resting on shelves 108 of gliding component 100. At this point, using handle bar 110 gliding component 100 may slide in the direction of M.2 socket 502 with a slight amount of pressure at the end as the sloped sections of gliding guide 104 engage sloped sections 210 inside track gap 208. This action locks gliding component 100 into place at a position approximately mid-length of M.2 drive 404. By mid-length is meant a location in between the edges of M.2 drive 404 and not necessarily halfway between.

Accordingly, this fastening assembly eliminates the need for using a screw to fasten M.2 drive 404 to board 500. To remove electronic device 404 from the assembly, the steps depicted in FIGS. 12A to 12D are reversed. The process of installing and removing electronic device 404 is therefore made easy, fast and reliable by the fastening system of the present disclosure. In certain environments, such as when testing such electronic devices as M.2 drives, there is a need to install and remove devices being tested as quickly and reliably as possible. The fastening assembly with the gliding mechanism of the present disclosure provides the ability to quickly install, reliably secure and then remove each drive without the need for screws or other time consuming fastening mechanisms. Furthermore, the fastening mechanism of the present disclosure can hold the electronic device in place without any physical pressure. This helps minimize bending and warpage as well as potential damage to components on the electronic device or the host board.

As the foregoing demonstrates, embodiments of the present disclosure provide tools and techniques for inserting an electronic device into, and removing it from, a host very quickly and reliably. The electronic device fastening assembly disclosed herein is easy to use and minimizes the likelihood of damage to the components on the device or the host. While the above exemplary embodiments have been described in some detail for purposes of clarity and understanding, the present invention is not limited to the details provided herein. There are alternatives and modifications to these embodiments that would be apparent to one of skilled in this art. For example, it is possible for the fastening assembly to include more than two tracks to accommodate multiple electronic devices that are secured on a host board in parallel. This would allow for, for example, testing multiple M.2 drives in parallel. The disclosed embodiments therefore are illustrative and not limiting with respect to the scope of the present invention, which is defined by the claims set forth below.

What is claimed is:

1. An apparatus comprising:
a fastening assembly having a glider component and first and second slider tracks;
wherein, the glider component includes first and second glider bases, each glider base having a first surface with a gliding guide and a guide wall extending in parallel on the first surface, whereby an edge of the first surface of each glider base extending from its respective guide wall forms a shelf, the glider component further including a handle bar coupling an end of the first glider base to an end of the second glider base forming a monolithic structure for the glider component,
wherein, each of the first and second slider tracks has a first foot and a second foot with a track span formed therebetween, each foot having a fastening feature to enable fastening the slider track to a base structure, the track span having an inner surface with a track gap formed therein, the track gap having a dimension designed to fit the gliding guide therein, enabling sliding of the glider component over the first and second tracks in alignment with the gliding guide, and wherein, a top surface of each gliding guide and an inner surface of each track gap include sloped sections such that as the glider component slides over the tracks, when it reaches an end of the track, a stable engagement is secured between the gliding guides and the tracks.

2. The apparatus of claim 1 wherein the top surface of each gliding guide comprises a first sloped section that is sloped at a first predetermined angle, a level mid-section and a second sloped section that is sloped at a second predetermined angle.

3. The apparatus of claim 2 wherein the first predetermined angle is different than the second predetermined angle.

4. The appartus of claim 1 wherein the inner surface of each track gap comprises a first sloped section ending at a sidewall of the first foot, a level middle section, and a second sloped section ending at a sidewall of the second foot.

5. The apparatus of claim 4 wherein the first sloped section of each track gap is sloped at a first predetermined angle and the second sloped section of each track gap is sloped at a second predetermined angle that is substantially equal to the first predetermined angle.

6. The apparatus of claim 1 further comprising a host board, the host board having a first interface connector installed thereon and further including four board engagement features that engage fastening features of the first and second slider tracks to secure the first and second slider tracks on the host board.

7. The apparatus of claim 6 wherein the fastening features of the first and second slider tracks comprise a first set of drill holes, and the four board engagement features comprise a second set of drill holes that match the first set of drill holes, whereby first and second slider tracks are secured onto the host board via screws that fasten the first set of drill holes to the second set of drill holes, respectively.

8. The apparatus of claim 6 further comprising an electronic device that comprises a substantially rectangular and substantially flat printed circuit board having a second interface connector at one edge and one or more components on a first surface, the electronic device resting on the shelves of the glider component with the second interface connector mating with the first interface connector of the host board.

9. The appartus of claim 8 wherein the glider component further comprises a first and second guard features respectively formed below each end of the handle bar and above a respective shelf, wherein the glider components is adapted to slide over the electronic device in a direction toward the first interface connector, bringing the glider component to a locking position at a point between the front edge and the back edge of the electronic device, securing the electronic device in place between the shelves and guard features.

10. The apparatus of claim 9 wherein the electronic device comprises an M.2 solid state drive.

11. The apparatus of claim 10 wherein the first interface connector on the host board is an M.2 socket, and wherein the host board comprises an M.2 adapter card.

12. The apparatus of claim 10 wherein a length of each slider track is approximately 3.250 inches.

13. The apparatus of claim 10 wherein the first slider track is secured on the host board with an inside edge at a distance of approximately one inch from an inside edge of the second slider track.

14. A fastening assembly comprising:
a host board having a first interface connector;
a first slider track and a second slider track installed in parallel on the host board;
a glider component having a first gliding guide engaging the first slider track and a second gliding guide engaging the second slider track, a first shelf and a second shelf, a handle bar adapted to slide the glider component along the first and second slider tracks and a first and second guard features respectively formed below each end of the handle bar and above a respective shelf; and
an electronic device having a second interface connector mating with the first interface connector of the host board, the electronic device resting on the first shelf and the second shelf of the glider component,
wherein, the glider component is configured such that the handle bar slides over the top surface of the electronic device along the first and second slider tracks arriving at a locking position at a point between a front edge and the back edge of the electronic device, thereby securing the electornic device in place between the shelves and guard features.

15. The fastening assembly of claim 14 wherein a top surface of each gliding guide comprises a first sloped section that is sloped at a first predetermined angle, a level mid-section and a second sloped section that is sloped at a second predetermined angle.

16. The fastening assembly of claim 15 wherein the first predetermined angle is different than the second predetermined angle.

17. The fastening assembly of claim 15 wherein an inner surface of each slider track comprises a gap, the inside surface of each gap comprises a first sloped section ending at a first endwall of the slider track, a level middle section, and a second sloped section ending at a second endwall of the slider track.

18. The fastening assembly of claim 17 wherein the first sloped section of each track gap is sloped at a first predetermined angle and the second sloped section of each track gap is sloped at a second predetermined angle that is substantially equal to the first predetermined angle.

19. The fastening assembly of claim 14 wherein the electronic device comprises an M.2 solid state drive.

20. The apparatus of claim 19 wherein the first interface connector on the host board is an M.2 socket, and wherein the host board comprises an adapter card.

\* \* \* \* \*